(12) United States Patent
Sun et al.

(10) Patent No.: US 11,626,725 B2
(45) Date of Patent: Apr. 11, 2023

(54) SST DRIVING CIRCUIT, CHIP AND DRIVING OUTPUT METHOD

(71) Applicant: MONTAGE TECHNOLOGY CO., LTD., Shanghai (CN)

(72) Inventors: Chunlai Sun, Shanghai (CN); Juan Du, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 17/458,498

(22) Filed: Aug. 26, 2021

(65) Prior Publication Data
US 2022/0376495 A1 Nov. 24, 2022

(30) Foreign Application Priority Data

Apr. 23, 2021 (CN) .......................... 202110443837.3

(51) Int. Cl.
*H02H 9/04* (2006.01)
*H03K 19/0944* (2006.01)
*H03K 19/00* (2006.01)
*H03K 19/003* (2006.01)

(52) U.S. Cl.
CPC ......... *H02H 9/046* (2013.01); *H03K 19/0005* (2013.01); *H03K 19/00315* (2013.01); *H03K 19/0944* (2013.01)

(58) Field of Classification Search
CPC ............... H02H 9/046; H03K 19/0005; H03K 19/00315; H03K 19/0944
USPC .......................................................... 361/56
See application file for complete search history.

(56) References Cited

U.S. PATENT DOCUMENTS

2014/0211350 A1* 7/2014 Cox .................... H01L 27/0251
361/56

* cited by examiner

*Primary Examiner* — Dharti H Patel

(57) ABSTRACT

The present disclosure provides an SST driving circuit, a chip, and a driving output method. The SST driving circuit includes: a signal driver for driving and outputting a signal to be driven, the signal driver including termination resistors; a first electrostatic current discharge module, providing first discharge paths for electrostatic currents generated in the signal driver; a second electrostatic current discharge module, connected in series with the termination resistors, providing second discharge paths for the electrostatic currents; and a power clamp, used for conducting the power clamp circuit, the first discharge paths and the second discharge paths when a power supply voltage of the signal driver exceeds a clamping voltage. The present disclosure provides different discharge paths, which effectively reduces voltage borne by a protected device through a voltage division method, and improves the device's ability to protect against electrostatic discharge.

15 Claims, 2 Drawing Sheets

SST DRIVING CIRCUIT, CHIP AND DRIVING OUTPUT METHOD

CROSS REFERENCE TO RELATED APPLICATION

The present application claims the benefit of priority to Chinese Patent Application No. CN 2021104438373, entitled "SST driving circuit, chip and driving output method", filed with CNIPA on Apr. 23, 2021, the disclosure of which is incorporated herein by reference in its entirety.

FIELD OF TECHNOLOGY

The present invention relates to integrated circuit design, in particular to a SST driving circuit, a chip, and a driving output method.

BACKGROUND

Stub Series Terminated (SST) drivers are widely used in a variety of high-speed data interfaces due to their simple structure, low power consumption, and perfect compatibility with Complementary Metal-Oxide-Semiconductor (CMOS) process. With the increasing demand for a higher interconnect transmission speed, the process techniques have entered the nanometer era from the deep submicron era, and more and more interface circuits, including SST drivers, are implemented with thin gate oxide devices. However, the fragility of thin gate oxide has brought more challenges for electrostatic protection.

The existing electrostatic protection for SST drivers is mainly achieved by a pair of diodes and a power clamp circuit. For example, when a positive electrostatic voltage is applied between an output port and a ground, a current flows through the forward direction of a p-type diode, flows to power supply, and then when the power clamp circuit detects the increase of power supply voltage, a protection circuit of the power clamp is turned on, thereby discharging current to the ground to protect internal devices by clamping the voltage between supply and ground. In such an electrostatic protection mode, an N-Metal-Oxide-Semiconductor (NMOS) device in the SST driver is the most susceptible to electrostatic damage. Conversely, if a positive electrostatic voltage is applied between the power supply and the output port, a Positive channel Metal Oxide Semiconductor (PMOS) device in the SST driver is the most susceptible to electrostatic damage.

For Human Body Model (HBM) 2 KV electrostatic test, the maximum current is about 1.3 A. The impedance of the power clamp circuit can be less than 1 ohm so that the voltage difference across the power clamp circuit is less than or equal to 1V. For modern nano-scale CMOS process, the gate oxide breakdown voltage of thin gate devices is usually less than or equal to 3V. Therefore, in order to protect NMOS devices from damage, the impedance of P-diode needs to be in the order of 1 ohm, which means V(diode)= 0.7V+1.3 A*1 ohm=2.0V, where 0.7V is the forward-conducting voltage of the diode. It can be seen that a P-type diode with a larger size will be required, resulting in excessive capacitive loads and deteriorated signal integrity, ultimately affecting signal transmission data rate and causing unnecessary power consumption.

Therefore, how to provide a SST driving circuit, a chip, and a driving output method to address the inability of the prior art to provide a higher electrostatic protection capability for SST drivers, is an urgent technical problem facing those skilled in the art.

SUMMARY

The present disclosure provide a SST driving circuit, a chip, and a driving output method to address the inability of the prior art to provide a higher electrostatic protection capability for SST drivers.

The present disclosure provides an SST driving circuit, a chip, and a driving output method. The SST driving circuit includes: a signal driver for driving and outputting a signal to be driven, the signal driver including termination resistors; a first electrostatic current discharge module, providing first discharge paths for electrostatic currents; a second electrostatic current discharge module, connected in series with the termination resistors, providing second discharge paths for the electrostatic currents; and a power clamp, used for turning on the power clamp circuit, the first discharge paths and the second discharge paths when a power supply voltage of the signal driver exceeds a clamping voltage, in order to conduct and discharge electrostatic currents between the power supply and the ground, and provide electrostatic protection for the signal driver.

In one embodiment, the first electrostatic current discharge module includes a first P-path protective unit and a first N-path protective unit. One end of the first P-path protective unit is connected to a power supply, the other end of the first P-path protective unit is connected to one end of the first N-path protective unit, and the other end of the first N-path protective unit is connected to the ground.

In one embodiment, the first P-path protective unit includes a first P-path protective diode, and the first N-path protective unit includes a first N-path protective diode; a cathode of the first P-path protective diode is connected to the power supply, an anode of the first P-path protective diode is connected to a cathode of the first N-path protective diode, and an anode of the first N-path protective diode is connected to the ground; a connection point of the first P-path protective diode and the first N-path protective diode is an output port of the SST driving circuit; the first P-path protective diode conducts when a positive electrostatic voltage is generated between the output port and the power supply, to provide a first discharge path for the electrostatic currents; the first N-path protective diode conducts when a positive electrostatic voltage is generated between the ground and the output port, to provide a first discharge path for the electrostatic currents.

In an embodiment of the present disclosure, the second electrostatic current discharge module includes a second P-path protective unit and a second N-path protective unit, one end of the second P-path protective unit is connected to the power supply, and the other end of the second P-path protective unit is connected to the signal driver; one end of the second N-path protective unit is connected to the signal driver, and the other end of the second N-path protective unit is connected to the ground.

In an embodiment of the present disclosure, the second P-path protective unit includes a second P-path protective diode, and the second N-path protective unit includes a second N-path protective diode; a cathode of the second P-path protective diode is connected to the power supply, and an anode of the second P-path protective diode is connected to the signal driver; the second P-path protective diode conducts when a positive electrostatic voltage is generated between the output port and the power supply, to provide a second discharge path for the electrostatic currents; an anode of the second N-path protective diode is connected to the ground, and a cathode of the second N-path protective diode is connected to the signal driver; the second N-path protective diode conducts when a positive electrostatic voltage is generated between the ground and the output port to provide a second discharge path for the electrostatic currents.

In an embodiment of the present disclosure, the signal driver includes a P-side driving unit and an N-side driving unit, a connection point of the P-side driving unit and the N-side driving unit is the output port of the SST driving circuit, and the P-side driving unit and the N-side driving unit divide and drive the signal to be driven; an anode of the second P-path protective diode is connected to the N-side driving unit and a cathode of the second N-path protective diode is connected to the P-side driving unit.

In an embodiment of the present disclosure, a voltage range driven by the P-side driving unit is greater than a voltage range driven by the N-side driving unit.

In an embodiment of the present disclosure, the P-side driving unit includes a PMOS transistor and a P-side resistor, the P-side resistor is a first termination resistor, a source of the PMOS transistor is connected to the power supply, a gate of the PMOS transistor receives the signal to be driven, a drain of PMOS transistor is connected to one end of the P-side resistor, and the other end of the P-side resistor is connected to the N-side driving unit.

In an embodiment of the present disclosure, the PMOS transistor is a thin oxide device. In an embodiment of the present disclosure, one end of the P-side resistor is connected to the cathode of the second N-path protective diode; the P-side resistor and the second N-path protective diode, which conducts, form a second discharge path when a positive electrostatic voltage is generated between the ground and the output port.

In an embodiment of the present disclosure, the P-side driving unit further includes: a first inverter, the first inverter receives and drives the signal to be driven, and an output terminal of the first inverter is connected to the gate of the PMOS transistor.

In an embodiment of the present disclosure, the N-side driving unit includes: an NMOS transistor and an N-side resistor, wherein the N-side resistor is a second termination resistor, a source of the NMOS transistor is connected to the ground, a gate of the NMOS transistor receives the signal to be driven, a drain of the NMOS transistor is connected to one end of the N-side resistor, and the other end of the N-side resistor is connected to the P-side driving unit.

In an embodiment of the present disclosure, the NMOS transistor is a thin oxide device.

In an embodiment of the present disclosure, one end of the N-side resistor is connected to the anode of the second P-path protective diode; the N-side resistor and the conducting second P-path protective diode form a second discharge path when a positive electrostatic voltage is generated between the output port and the power supply.

In an embodiment of the present disclosure, the N-side driving unit further includes: a second inverter, the second inverter receives and drives the signal to be driven, and an output terminal of the second inverter is connected to the gate of the NMOS transistor.

The present disclosure also provides a chip including: the SST driving circuit.

The present disclosure further provides a driving output method applied to the SST driving circuit; the driving output method includes: inputting an external signal to be driven into the SST driving circuit for driving output; and in the process of driving and outputting the signal to be driven, when there is an electrostatic voltage between the output port of the SST driving circuit and the power supply or the ground, turning on the first discharge paths, the second discharge paths and a power clamp circuit for protection against electrostatic discharge.

The above is an overview of the application, which may be simplified, summarized and omitted in detail. Therefore, those skilled in the art should realize that this part is only illustrative and is not intended to limit the scope of the application in any way. This summary section is neither intended to determine the key features or essential features of the claimed subject matter, nor is it intended to be used as an auxiliary means to determine the scope of the claimed subject matter.

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure. It should be noted that the following embodiments and the features in the embodiments can be combined with each other if no conflict will result.

It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated.

The principle and implementation of the SST driving circuit, chip, and driving output method of the present disclosure will be described in detail below with reference to FIGS. 1 to 5, so that those skilled in the art can understand the SST driving circuit, chip and driving output method without creative work.

Figure 1:
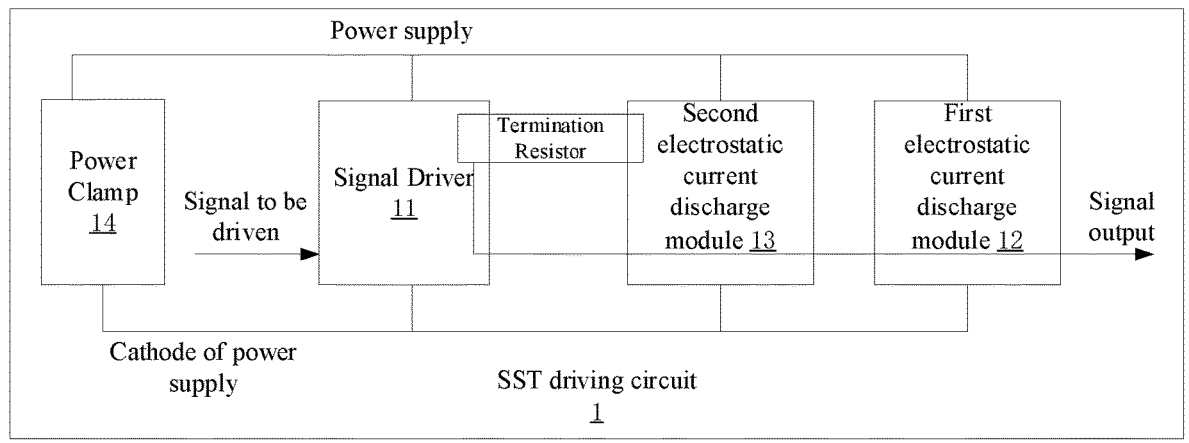
FIG. 1 is a block diagram showing a structure of a SST driving circuit according to one embodiment of the present disclosure.

Please refer to FIG. 1, which is a block diagram showing a structure of a SST driving circuit according to one embodiment of the present disclosure. As shown in FIG. 1, an external signal to be driven is input to the SST driving circuit for driving output to generate an output signal; the SST driving circuit includes: a signal driver 11, a first electrostatic current discharge module 12, a second electrostatic current discharge module 13, and a power clamp 14.

The signal driver 11 drives and outputs the signal to be driven, and the signal driver 11 includes termination resistors.

The first electrostatic current discharge module 12 provides first discharge paths for electrostatic currents generated in the signal driver.

The second electrostatic current discharge module 13 is connected in series with the termination resistors, and provides second discharge paths for the electrostatic currents.

The power clamp 14 is connected to the signal driver 11, the first electrostatic current discharge module 12 and the second electrostatic current discharge module 13 respectively, and used for turning on the power clamp circuit, the first discharge paths and the second discharge paths when the power supply voltage of the signal driver exceeds a clamping voltage, to protect the signal driver from electrostatic currents.

It should be noted that the power clamp described in the present disclosure can be any circuit or device in the prior art that can realize monitoring through the principle of clamping, and the present disclosure is not limiting in this regard. Voltage monitoring in the present disclosure before clamping can be a direct monitoring of the voltage value, or an indirect monitoring of the voltage value that is based on monitoring the current or other electrical values in the circuit, and the present disclosure is not limiting in this regard.

It should be noted that the present disclosure does not limit the number of first electrostatic current discharge module(s) and second electrostatic current discharge module(s). The SST driving circuit can include one first electrostatic current discharge module and one second electrostatic current discharge module, or include a combination of one or more first electrostatic current discharge modules and one or more of second electrostatic current discharge modules, and the numbers of the first electrostatic current discharge module(s) and the second electrostatic current discharge module(s) can be the same or different.

Figure 2:
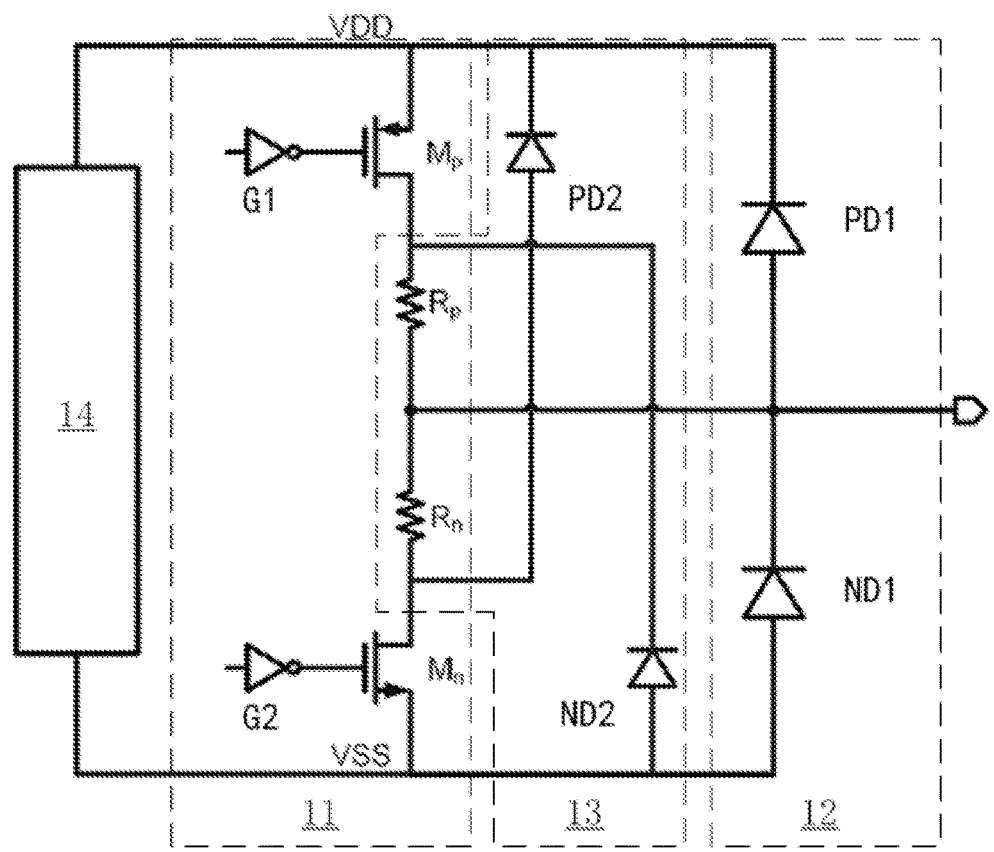
FIG. 2 shows a circuit structure of a SST driving circuit according to one embodiment of the present disclosure.

Please refer to FIG. 2, which shows a circuit structure of the SST driving circuit according to one embodiment of the present disclosure. FIG. 2 shows the specific circuitry and connection relationships of the signal driver 11, the first electrostatic current discharge module 12, the second electrostatic current discharge module 13, and the power clamp 14.

In an embodiment of the present disclosure, the power clamp 14 includes a power clamp circuit, where the power clamp circuit is turned on when a voltage at power supply to which the signal driver is connected exceeds a clamping voltage.

In an embodiment of the present disclosure, the first electrostatic current discharge module 12 includes a first P-path protective unit and a first N-path protective unit.

One end of the first P-path protective unit is connected to a power supply, the other end of the first P-path protective unit is connected to one end of the first N-path protective unit, and the other end of the first N-path protective unit is connected to the ground.

Specifically, the first P-path protective unit includes a first P-path protective diode PD1, and the first N-path protective unit includes a first N-path protective diode ND1; a cathode of the first P-path protective diode PD1 is connected to the power supply VDD, and an anode of the first P-path protective diode PD1 is connected to a cathode of the first N-path protective diode ND1; an anode of the first N-path protective diode ND1 is connected to the ground VSS.

The connection point of the first P-path protective diode PD1 and the first N-path protective diode ND1 is an output port of the SST driving circuit; the first P-path protective diode conducts when a positive electrostatic voltage is generated between the output port and the power supply VDD, to provide a first discharge path for the electrostatic currents; the first N-path protective diode conducts when a positive electrostatic voltage is generated between the ground VSS and the output port, to provide a first discharge path for the electrostatic currents.

In an embodiment of the present disclosure, the second electrostatic current discharge module 13 includes a second P-path protective unit and a second N-path protective unit.

One end of the second P-path protective unit is connected to the power supply VDD, and the other end is connected to the signal driver; one end of the second N-path protective unit is connected to the signal driver, and the other end is connected to the ground VSS.

Specifically, the second P-path protective unit includes a second P-path protective diode PD2, and the second N-path protective unit includes a second N-path protective diode ND2.

A cathode of the second P-path protective diode PD2 is connected to the power supply VDD, and an anode of the second P-path protective diode PD2 is connected to the signal driver; the second P-path protective diode PD2 conducts when a positive electrostatic voltage is generated between the output port and the power supply VDD, and along with a second termination resistor $R_n$, to provide a second discharge path for the electrostatic currents.

An anode of the second N-path protective diode ND2 is connected to the ground VSS, and its cathode is connected to the signal driver; the second N-path protective diode ND2 conducts when a positive electrostatic voltage is generated between the ground VSS and the output port, and along with the termination resistor $R_p$, provides a second discharge path for the electrostatic currents.

In an embodiment of the present disclosure, the signal driver includes a P-side driving unit and an N-side driving unit, a connection point of the P-side driving unit and the N-side driving unit is the output port of the SST driving circuit, and the P-side driving unit and the N-side driving unit drive the signal to be driven.

The anode of the second P-path protective diode is connected to the N-side driving unit and the cathode of the second N-path protective diode is connected to the P-side driving unit.

In an embodiment of the present disclosure, a voltage range driven by the P-side driving unit is greater than a voltage range driven by the N-side driving unit.

Specifically, the P-side drive unit includes a PMOS transistor $M_P$ and a P-side resistor $R_P$, and the P-side resistor $R_p$ is a first termination resistor. The source of the PMOS transistor $M_p$ is connected to the power supply VDD, the gate of the PMOS transistor receives the signal to be driven, the drain of PMOS transistor is connected to one end of the P-side resistor $R_p$, and the other end of the P-side resistor $R_p$ is connected to the N-side driving unit.

Further, one end of the P-side resistor $R_p$ is connected to the cathode of the second N-path protective diode, the P-side resistor $R_p$ and the second N-path protective diode, which conducts, form a second discharge path when a positive electrostatic voltage is generated between the ground VSS and the output port.

Further, the P-side driving unit further includes: a first inverter G1; the first inverter G1 receives and drives the signal to be driven, and an output terminal of the first inverter G1 is connected to the gate of the PMOS transistor $M_p$.

In an embodiment of the present invention, the N-side driving unit includes an NMOS transistor $M_n$ and an N-side resistor $R_n$; the N-side resistor is a second termination resistor $R_n$.

The source of the NMOS transistor Mn is connected to the ground VSS, and the gate receives the signal to be driven, the drain is connected to one end of the N-side resistor $R_N$, and the other end of the N-side resistor $R_n$ is connected to the the P-side driving unit.

In an embodiment of the present disclosure, the NMOS transistor $M_n$ may be a thin oxide device, such as a thin gate NMOS transistor. Similarly, the PMOS transistor $M_p$ may be a thin oxide device, such as a thin gate PMOS transistor.

Further, one end of the N-side resistor $R_n$ is connected to the anode of the second P-path protective diode, and the N-side resistor $R_n$ and the conducting second P-path protective diode, form a second discharge path when a positive electrostatic voltage is generated between the output port and the power supply VDD.

Further, the N-side driving unit further includes a second inverter G2, the second inverter G2 receives and drives the signal to be driven, and an output terminal of the second inverter G2 is connected to the gate of the NMOS transistor $M_n$.

Figure 3:
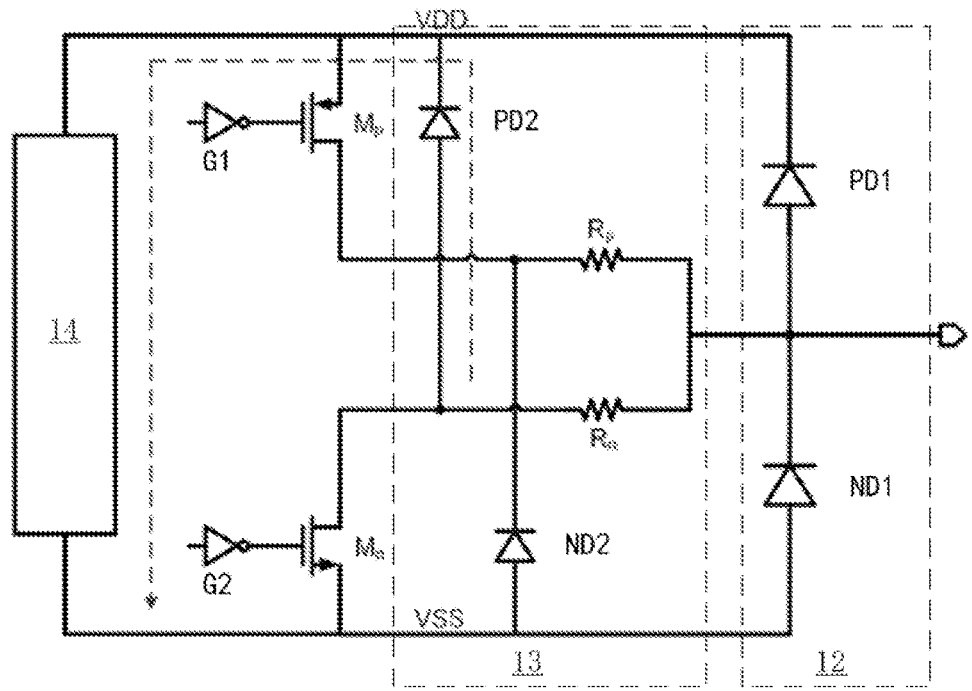
FIG. 3 is a schematic circuit diagram of a SST driving circuit according to one embodiment of the present disclosure.

Referring to FIG. 3, which is a schematic circuit diagram of the SST driving circuit according to one embodiment of the present disclosure. Compared to FIG. 2, the layout of the components (mainly the termination resistors) in FIG. 3 is different. The path indicated by the dashed arrow in FIG. 3 is a discharge path of the second electrostatic current discharge module when an positive electrostatic voltage is applied between the output port and the ground VSS. The principle of discharging electrostatic currents is explained below.

When a positive electrostatic voltage Va is applied between the output port and the ground VSS (for example, the voltage at the output port is higher than VDD, and causes the voltage at the power supply VDD to increase, and the voltage of the ground VSS is 0V), the voltage at the power supply VDD is between voltages of the output port and the ground VSS, and is a certain value between the voltage of power supply VDD and Va. At this time, the voltage of the output port is Va, and VSS is 0V, and the PD1 and PD2 conduct because of the existence of forward voltage differences. On the one hand, a current flows through the forward-conducting PD1, flows to the power supply VDD, then the power clamp detects an increase in voltage at power supply VDD (for example, exceeding a clamp voltage of power clamp circuit) and turns on its power clamp circuit, so that electrostatic current of the output port is discharged from the power clamp to the ground VSS; on the other hand, a current flows through the second termination resistor $R_N$ to the forward-conducting PD2, and flows to power supply VDD, then the power clamp detects an increase in voltage at power supply VDD and turns on the power clamp circuit, and the electrostatic current of the output port is discharged from the power clamp to the ground VSS.

When a positive electrostatic voltage Vb is applied between the power supply VDD and the output port (for example, making the voltage at the power supply VDD higher and the output port voltage 0V), the voltage of the ground VSS is between the output port voltage and the voltage at the power supply VDD. At this time, the voltage at the ground VSS is between 0 and Vb, and is of a certain heightened positive voltage value, and ND1 and ND2 conduct because of the forward voltage differences. On the one hand, the power clamp detects an increased voltage at power supply VDD (for example, exceeding the clamp voltage of power clamp circuit) and turns on the power clamp circuit, so that an electrostatic current of VDD is discharged from power clamp to the ground VSS, and then flows from VSS to ND1 to reach the output port, thereby completing the electrostatic discharge. On the other hand, the power clamp detects an increased voltage at power supply VDD and turns on the power clamp circuit, so that an electrostatic current of VDD is discharged from power clamp to the ground VSS, and flows from VSS to ND2, $R_P$, then to the output port, thereby completing the electrostatic discharge.

Taking the application of a positive electrostatic voltage Va between the output port and the ground VSS as an example to illustrate the beneficial effects of the present disclosure.

On one hand, the paths from the output port to the power supply VDD include an additional path formed by $R_n$ and the forward-conducting PD2 connected in series, which is connected in parallel with forward-conducting PD1 to jointly discharge the electrostatic currents from the output port to the power supply. Therefore, the voltage difference between a drain and a gate of the most vulnerable device, i.e. the NMOS transistor $M_n$, becomes the sum of voltage difference across the forward-conducting PD2 and voltage difference across the power clamp circuit, as shown by the dashed arrow in FIG. 3. Assume the path impedance of the resistor $R_n$ and the forward-conducting PD2 connected in series is much greater than that of the first-level P-type diode PD1, the following formula can be obtained: voltage difference between the drain and gate $V_{gd}=V_{pdio2}+V_{clamp}=0.7 V+I_{ESD}*R_{pdio1}*R_{pdio2}/(R_n+R_{pdio2})+I_{ESD}*R_{clamp}$, where $V_{gd}$ is the voltage difference between the drain and gate of the NMOS transistor $M_n$, $V_{pdio2}$ is the voltage difference across the forward-conducting PD2, $W_{clamp}$ is the voltage difference across the power clamp circuit, 0.7V is the forward-conducting voltage of the diode, and $I_{ESD}$ is electrostatic current, $R_{pdio1}$ is the on-resistance of PD1, $R_{pdio2}$ is the on-resistance of PD2, and $R_{clamp}$ is the on-resistance of the power clamp circuit. It can be seen that the present disclosure divides the forward-conducting voltage of PD1, and the voltage division coefficient is $R_{pdio2}/(R_n+R_{pdio2})$.

Considering conditions of the HBM 2 KV electrostatic test, the peak current is about 1.3 A. Since the power clamp circuit has not undergone any changes, the voltage difference across the power clamp circuit remains less than or equal to 1V. The resistance of the resistor $R_n$ is usually on the order of tens of ohms. Taking 50 ohms as an example, assuming that the impedance of PD2 is also 50 ohms, the above-mentioned voltage division coefficient is 0.5. Therefore, when the impedance of PD1 is still 1 ohm, the actual partial voltage of PD2 is: 1.3 A*1 ohm*0.5=0.65V. Substituting 0.65V into the above formula, the final $V_{gd}=0.7V+0.65V+1V=2.35V$, which can meet the requirement that the gate oxide breakdown voltage of thin gate devices is usually less than or equal to 3V. Compared with a conventional circuit using only PD1 alone, the cost of the present disclosure is low because it only needs to increase the size of PD1 by 1/50. If the conventional circuit is used to achieve the above effects, the $V_{gd}$ will need to be reduced to 2.35V, which means the size of the PD1 will need to be doubled. Therefore, the circuit structure of the present disclosure is advantageous over the conventional circuit.

On the other hand, if it is assumed that the structure proposed by the present disclosure meets the requirement of $V_{gd}$=3.0V, and assuming that the voltage division coefficient remains 0.5, it can be inferred that the size of the first-level P-type diode only needs to be half of that of the conventional circuit. Therefore, while retaining the same electrostatic protection capability, the present disclosure enables a smaller size of first-level diodes, thereby achieving a smaller capacitive load, increasing signal transmission data rate, and reducing power consumption.

When a positive electrostatic voltage Vb is applied between the power supply VDD and the output port, beneficial effects produced is the same. The path formed by the resistor Rp and the forward-conducting ND2 connected in series can help to reduce the voltage of the drain of the PMOS transistor Mp, the details of which will not be repeated here.

Figure 4:
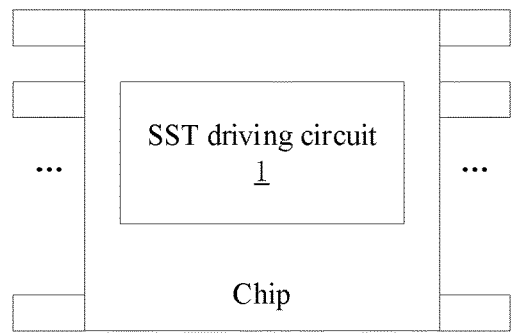
FIG. 4 shows a structure of a chip according to one embodiment of the present disclosure.

Please refer to FIG. 4, which shows a schematic diagram of a structure of a chip of the present disclosure in an embodiment. As shown in FIG. 4, the chip described in the present disclosure includes the SST driving circuit according to above embodiments; and an external signal to be driven is input to the SST driving circuit for driving output.

The SST driving circuit includes: a signal driver for driving and outputting a signal to be driven, the signal driver including termination resistors; a first electrostatic current discharge module, providing first discharge paths for electrostatic currents generated in the signal driver; a second electrostatic current discharge module, connected in series with the termination resistors, providing second discharge paths for the electrostatic currents; and a power clamp, connected to the first electrostatic current discharge module and the second electrostatic current discharge module, used for turning on the power clamp circuit, the first discharge paths, and the second discharge paths when a voltage at power supply to which the signal driver is connected exceeds a clamping voltage, to discharge electrostatic currents and provide electrostatic protection for the signal driver.

Figure 5:
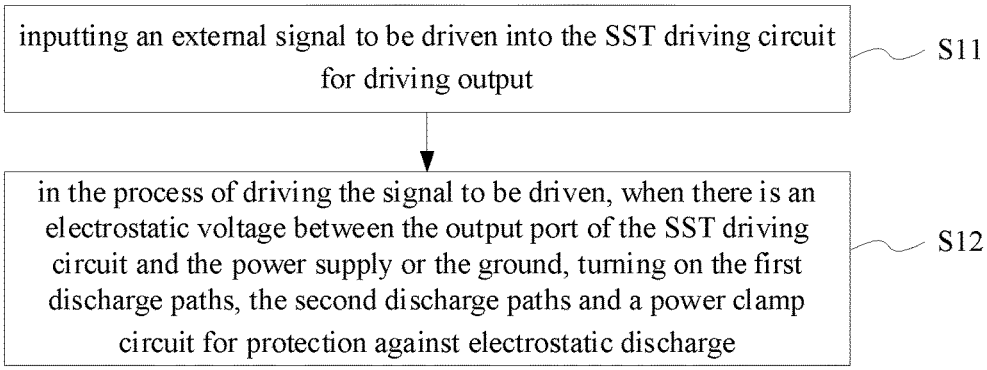
FIG. 5 shows a flowchart illustrating various steps of a driving output method according to one embodiment of the present disclosure.

Please refer to FIG. 5, which shows a flowchart illustrating various steps of a driving output method according to one embodiment of the present disclosure. As shown in FIG. 5, the driving output method is applied to the SST driving circuit described in the present disclosure and specifically includes the following steps:

S11, inputting an external signal to be driven into the SST driving circuit for driving output.

S12, in the process of driving and outputting the signal to be driven, conducting the first discharge paths and the second discharge paths when there is an electrostatic voltage between the output port of the SST driving circuit and the power supply or the ground and turning on the power clamp circuit when a voltage at power supply to which the signal driver is connected exceeds a clamping voltage, to carry out electrostatic protection.

The scope of protection of the driving output method described in the present disclosure is not limited to the order of execution of the steps listed in the present disclosure, and all the steps implemented in the prior art based on the principles of the present disclosure and implemented by replacing, adding, removing steps are included in the scope of the present disclosure.

The principle of the driving output method described in the present disclosure corresponds to the SST driving circuit. The SST driving circuit described in the present disclosure can implement the driving output method described in the present disclosure. The implementation device includes, but is not limited to, the structure of the SST driving circuit listed in this embodiment. Any structural modification and replacement of the prior art based on the principle of the present disclosure are included in the protection scope of the present disclosure.

In summary, the SST driving circuit, chip and driving output method of the present disclosure improves electrostatic protection structures of existing SST drivers by adding second-level protective diodes (i.e., second electrostatic current discharge module) on the basis of the conventional electrostatic protection structure, and the second-level protective diodes and termination resistors in SST driving circuit are connected in series and form new electrostatic discharge paths, which effectively reduces voltage borne by the protected device through a voltage division method, and improves the device's ability to protect against electrostatic discharge. On the other hand, compared with the prior art, while retaining the same electrostatic protection capability, the present disclosure enables the smaller size of first-level protective diodes, thereby achieving a smaller capacitive load, increasing signal transmission data rate, and reducing power consumption. The above-mentioned embodiments only exemplarily illustrate the principles and effects of the present disclosure, but are not used to limit the present disclosure. Anyone familiar with this technology can modify or change the above-mentioned embodiments without departing from the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. An SST driving circuit, wherein an external signal to be driven is input to the SST driving circuit for driving output, wherein the SST driving circuit comprises:

a signal driver, which drives and outputs the signal to be driven, wherein the signal driver comprises termination resistors;

a first electrostatic current discharge module, which provides first discharge paths for electrostatic currents generated in the signal driver;

a second electrostatic current discharge module, connected in series with the termination resistors, for providing second discharge paths for the electrostatic currents; and a power clamp, connected to the first electrostatic current discharge module and the second electrostatic current discharge module respectively, and used for conducting the power clamp circuit, the first discharge paths, and the second discharge paths when the power supply voltage of the signal driver exceeds a clamping voltage to protect the signal driver against electrostatic damage, wherein the second electrostatic current discharge module further comprises a second P-path protective diode, and a second N-path protective diode;

wherein a cathode of the second P-path protective diode is connected to the power supply, and an anode of the second P-path protective diode is connected to the signal driver, wherein the second P-path protective diode conducts when a positive electrostatic voltage is generated between the output port and the power supply, to provide a second discharge path for the electrostatic currents;

wherein an anode of the second N-path protective diode is connected to the ground, and a cathode of the second N-path protective diode is connected to the signal driver, wherein the second N-path protective diode conducts when a positive electrostatic voltage is generated between the ground and the output port to provide a second discharge path for the electrostatic currents.

2. The SST driving circuit of claim 1, wherein the first electrostatic current discharge module comprises a first P-path protective unit and a first N-path protective unit,
wherein one end of the first P-path protective unit is connected to a power supply, the other end of the first P-path protective unit is connected to one end of the first N-path protective unit, and the other end of the first N-path protective unit is connected to the ground.

3. The SST driving circuit of claim 2, wherein the first P-path protective unit comprises a first P-path protective diode, and the first N-path protective unit comprises a first N-path protective diode,
wherein a cathode of the first P-path protective diode is connected to the power supply, an anode of the first P-path protective diode is connected to a cathode of the first N-path protective diode, and an anode of the first N-path protective diode is connected to the ground,
wherein a connection point of the first P-path protective diode and the first N-path protective diode is an output port of the SST driving circuit, and the first P-path protective diode conducts when a positive electrostatic voltage is generated between the output port and the power supply, to provide a first discharge path for the electrostatic currents, wherein the first N-path protective diode conducts when a positive electrostatic voltage is generated between the ground and the output port, to provide a first discharge path for the electrostatic currents.

4. The SST driving circuit according to claim 1, wherein the signal driver comprises a P-side driving unit and an N-side driving unit, a connection point of the P-side driving unit and the N-side driving unit is an output port of the SST driving circuit, and the P-side driving unit and the N-side driving unit drive the signal to be driven,
wherein an anode of the second P-path protective diode is connected to the N-side driving unit and a cathode of the second N-path protective diode is connected to the P-side driving unit.

5. The SST driving circuit of claim 4, wherein a voltage range driven by the P-side driving unit is greater than a voltage range driven by the N-side driving unit.

6. The SST driving circuit of claim 4, wherein the P-side driving unit comprises a PMOS transistor and a P-side resistor, wherein the P-side resistor is a first termination resistor,
wherein a source of the PMOS transistor is connected to the power supply, a gate of the PMOS transistor receives the signal to be driven, a drain of PMOS transistor is connected to one end of the P-side resistor, and the other end of the P-side resistor is connected to the N-side driving unit.

7. The SST driving circuit of claim 6, wherein one end of the P-side resistor is connected to the cathode of the second N-path protective diode, wherein the P-side resistor and the second N-path protective diode, which conducts, form a second discharge path when a positive electrostatic voltage is generated between the ground and the output port.

8. The SST driving circuit of claim 6, wherein the P-side driving unit further comprises: a first inverter,
wherein the first inverter receives and drives the signal to be driven, and an output terminal of the first inverter is connected to the gate of the PMOS transistor.

9. The SST driving circuit of claim 6, wherein the PMOS transistor is a thin oxide device.

10. The SST driving circuit of claim 4, wherein the N-side driving unit comprises an NMOS transistor and an N-side resistor, wherein the N-side resistor is a second termination resistor,
wherein a source of the NMOS transistor is connected to the ground, a gate of the NMOS transistor receives the signal to be driven, a drain of the NMOS transistor is connected to one end of the N-side resistor, and the other end of the N-side resistor is connected to the P-side driving unit.

11. The SST driving circuit of claim 10, wherein the NMOS transistor is a thin oxide device.

12. The SST driving circuit of claim 10, wherein one end of the N-side resistor is connected to the anode of the second P-path protective diode, wherein the N-side resistor and the conducting second P-path protective diode, which conducts, form a second discharge path when a positive electrostatic voltage is generated between the output port and the power supply.

13. The SST driving circuit of claim 10, wherein the N-side driving unit further comprises a second inverter,
wherein the second inverter receives and drives the signal to be driven, and an output terminal of the second inverter is connected to the gate of the NMOS transistor.

14. A chip, comprising:
The SST driving circuit according to claim 1.

15. A driving output method, applied to the SST driving circuit according to claim 1, wherein the driving output method comprises:
inputting an external signal to be driven into the SST driving circuit for driving output; and
when there is an electrostatic voltage between the output port of the SST driving circuit and the power supply or the ground, turning on the first discharge paths, the second discharge paths and a power clamp circuit for protection against electrostatic discharge.

* * * * *